United States Patent
Kwon et al.

(10) Patent No.: US 8,216,944 B2
(45) Date of Patent: Jul. 10, 2012

(54) METHODS OF FORMING PATTERNS IN SEMICONDUCTOR DEVICES

(75) Inventors: Yong-Hyun Kwon, Gyeonggi-do (KR); Jun Seo, Asan-si (KR); Jae-Seung Hwang, Suwon-si (KR); Ji-Young Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 94 days.

(21) Appl. No.: 12/715,788

(22) Filed: Mar. 2, 2010

(65) Prior Publication Data
US 2010/0221921 A1  Sep. 2, 2010

(30) Foreign Application Priority Data
Mar. 2, 2009 (KR) .......................... 10-2009-0017521

(51) Int. Cl.
*H01L 21/311* (2006.01)

(52) U.S. Cl. ........................................ 438/699; 438/696

(58) Field of Classification Search .................. 438/669, 438/699, 696, 703; 257/E21.241; 430/313, 430/311
See application file for complete search history.

(56) References Cited

U.S. PATENT DOCUMENTS

| | | | | |
|---|---|---|---|---|
| 6,960,530 B2 * | 11/2005 | Wu et al. | ........................ | 438/701 |
| 2006/0240361 A1 * | 10/2006 | Lee et al. | ........................ | 430/313 |
| 2008/0090419 A1 | 4/2008 | Koh et al. | | |
| 2009/0209109 A1 * | 8/2009 | Yaegashi et al. | .............. | 438/736 |

FOREIGN PATENT DOCUMENTS

| | | |
|---|---|---|
| KR | 1020020046040 A | 6/2002 |
| KR | 1020060110706 A | 10/2006 |

* cited by examiner

*Primary Examiner* — Kevin M Picardat
*Assistant Examiner* — Neil Prasad
(74) *Attorney, Agent, or Firm* — Myers Bigel Sibley & Sajovec

(57) ABSTRACT

Methods of forming patterns in semiconductor devices are provided including forming first patterns spaced apart from one another on an object structure. A first sacrificial layer is formed conformally on the first patterns and the object structure. A second pattern is formed on a sidewall of the first sacrificial layer, the second pattern having a height smaller than that of the first pattern from an upper surface of the object structure. The first patterns are selectively removed to form an opening that exposes the object structure. A third pattern is formed on a sidewall of the opening.

9 Claims, 7 Drawing Sheets

METHODS OF FORMING PATTERNS IN SEMICONDUCTOR DEVICES

CLAIM OF PRIORITY

This application claims priority to Korean Patent Application No. 2009-17521, filed Mar. 2, 2009, the contents of which are hereby incorporated herein by reference.

FIELD

This invention relates to semiconductor devices and, more particularly, to methods of forming fine patterns having a small line width below the resolution limit of photolithography in semiconductor devices.

BACKGROUND

Semiconductor devices having rapid operation speeds as well as high capacitances are desirable. In order to meet these demands, semiconductor devices are being developed to improve the degree of integration, reliability and response speeds thereof. In particular, as semiconductor devices are highly integrated, a design rule of these semiconductor devices may be reduced.

Thus, an isolation layer or a metal wiring in the semiconductor device may be formed to have a fine (thin) line width. However, photolithography processes used to fabricate these layers/wirings may have resolution limits. Accordingly, it may not be easy to form the isolation layer or the metal wiring having a line width below the resolution limit of the photolithography process.

SUMMARY

Some embodiments provide methods of forming a pattern including forming first patterns spaced apart from one another on an object structure. A first sacrificial layer is formed conformally on the first patterns and the object structure. A second pattern is formed on a sidewall of the first sacrificial layer, the second pattern having a height smaller than that of the first pattern from an upper surface of the object structure. The first patterns are selectively removed to form an opening that exposes the object structure. A third pattern is formed on a sidewall of the opening.

In further embodiments, forming the second pattern may include forming a first pattern layer conformally on the first sacrificial layer and etching the first pattern layer until an upper surface, an upper sidewall and a lower surface of the first sacrificial layer are exposed.

In still further embodiments, forming the opening may include forming a second sacrificial layer to cover the first sacrificial layer and the second pattern and performing a planarization process on the first sacrificial layer and the second sacrificial layer to expose the first pattern. In these embodiments, forming the third pattern may include forming a second pattern layer conformally on the first sacrificial layer, the second sacrificial layer and the opening after performing the planarization process and selectively removing the second pattern layer until the first sacrificial layer and the second sacrificial layer are exposed.

In some embodiments, the method may further include forming a third sacrificial layer on the object structure to cover the third pattern after forming the third pattern, planarizing the first sacrificial layer, the second sacrificial layer and the third sacrificial layer until the second pattern and the third pattern are exposed, and removing the first sacrificial layer, the second sacrificial layer and the third sacrificial layer.

In further embodiments, the first pattern, the second pattern and the third pattern may be formed using materials having an etch selectivity with respect to the first sacrificial layer, the second sacrificial layer and the third sacrificial layer. The first pattern, the second pattern and the third pattern may be formed using the same materials. The first sacrificial layer, the second sacrificial layer and the third sacrificial layer may be formed using the same materials.

In still further embodiments, a width of the first pattern may be greater than twice a width of the third pattern.

In some embodiments, a distance between the first patterns may be greater than twice a width of the second pattern.

DETAILED DESCRIPTION OF THE EMBODIMENTS

Figure 1:
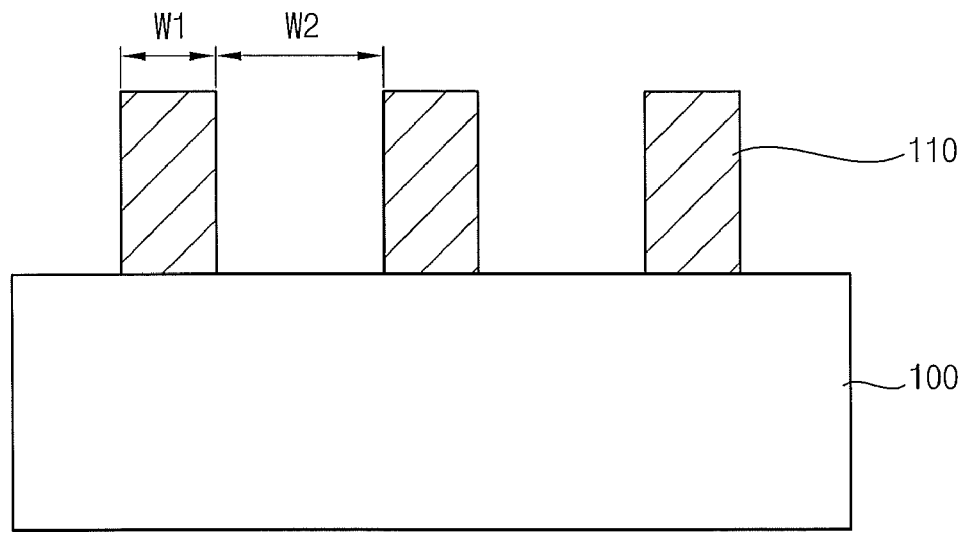
FIGS. 1 to 9 are cross-sections illustrating processing steps in the fabrication of patterns in accordance with some embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIGS. 1 to 9 are cross sections illustrating a method of forming a pattern in accordance with some embodiments. Referring first to FIG. 1, first patterns 110 are formed on an object structure 100. The object structure 100 may be a substrate, a conductive layer for a pattern or an insulation layer for forming a conductive pad. In some embodiments, the substrate may be a semiconductor substrate including silicon or germanium, for example, a silicon on insulator (SOI) substrate, a germanium on insulator (GOI) substrate, and the like. In further embodiments, the insulation layer may include an insulating material having a low dielectric constant such as tetraethyl orthosilicate (TEOS) or fluorine silicate glass (FSG).

The first pattern 110 may be formed using a material having an etch selectivity with respect to the object structure 100. In some embodiments, the first pattern 110 may be formed using, for example, silicon, nitride, oxide, carbide, oxynitride, carbonate, carbonitride, and the like In particular, the first pattern 100 may include silicon oxide, silicon nitride, silicon carbonate, silicon carbide, aluminum oxide, aluminum nitride, tantalum oxide, tantalum nitride, and the like. Examples of the silicon oxide may be medium temperature oxide (MTO), phosphosilicate glass (PSG), borophosphosilicate glass (BPSG), undoped silicate glass (USG), spin on glass (SOG), tetraethyl orthosilicate (TEOS), plasma enhanced-TEOS (PE-TEOS), and the like. In embodiments where the object structure 100 is an insulation layer, the first pattern 110 may be formed using, for example, polysilicon.

In some embodiments, the first pattern 110 may have a first width (W1). The first patterns 100 may be spaced apart from one another by a second width (W2). The corresponding first width (W1) and the second width (W2) may be properly selected based on widths and pitches of the final patterns. For example, the first width (W1) may be more than twice the width of a third pattern 160a (see FIG. 7) formed by a following process. The second width (W2) may be more than twice the sum of a thickness of a sacrificial layer 120 (see FIG. 2) and a width of a second pattern 130a (see FIG. 3).

In order to form the first patterns 110, after a first pattern layer is formed on the object structure 100, an amorphous carbon layer (not shown) and an anti-reflection layer (not shown) are sequentially formed on the first pattern layer. The amorphous carbon layer and the anti-reflection layer may be provided to protect a photoresist pattern (not shown) from a diffused reflection in a photolithography process to have a uniform sidewall profile. First photoresist patterns (not shown) are formed on the anti-reflection layer to be spaced apart by a first distance. The anti-reflection layer, the amorphous carbon layer and the first patter layer are etched using the first photoresist patterns to form the first patterns 110, an anti-reflection layer pattern (not shown), and an amorphous carbon layer pattern (not shown) are sequentially formed on the object structure 100. After forming the first patterns 110, the anti-reflection layer pattern, the amorphous carbon layer pattern and the first photoresist pattern are removed from the object structure 100.

Figure 2:
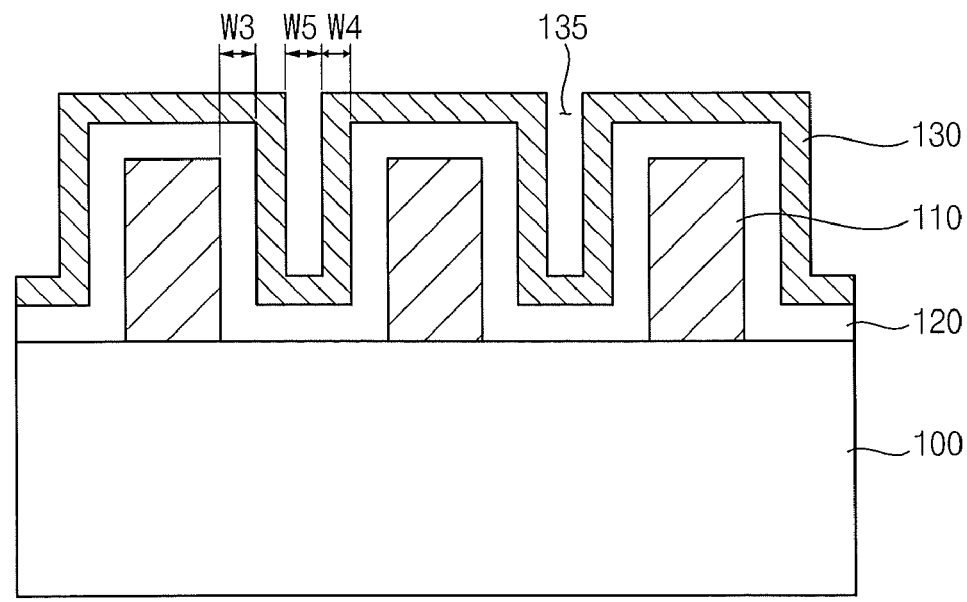

Referring now to FIG. 2, a first sacrificial layer 120 and a second pattern layer 130 are formed conformally on the first patterns 110. The first sacrificial layer 120 is conformally formed along profiles of the first patterns 110 and the object structure 100 to have a uniform thickness. A third width (W3) of the first sacrificial layer 120 may determine widths of a second pattern 130a (see FIG. 3) and a third pattern 160a (see FIG. 7).

The sacrificial layer 120 may be formed using a material having an etch selectivity with respect to the object structure 100 and the first pattern 110. In some embodiments, the first sacrificial layer 120 may be formed using silicon, nitride, oxide, carbide, oxynitride, carbonate, carbonitride, and the like For example, in embodiments where the first pattern 110 includes nitride, the first sacrificial layer 120 may be formed using oxide. In embodiments where the first pattern 110 includes oxide, the first sacrificial layer 120 may be formed using nitride. In embodiments where that the first pattern 110 includes polysilicon, the first sacrificial layer 120 may be formed using oxide or nitride.

Referring again to FIG. 2, a second pattern layer 130 is formed conformally along a profile of the first sacrificial layer 120. A thickness of the second pattern layer 130 may determine a fourth width (W4) of a second pattern 130a (see FIG. 3) to be formed on a sidewall of the first sacrificial layer 120. Since the second pattern layer 130 is formed conformally along the profile of the first sacrificial layer 120, a first recess 135 is formed in the second pattern layer 130 to have a fifth width (W5) corresponding to a distance between opposing sidewalls of the adjacent first patterns 110. The fifth width (W5) may determine a width between second patterns 130a (see FIG. 3).

In some embodiments, the second pattern layer 130 may be formed by an atomic layer deposition process. The second pattern layer 130 may be formed using a material having an etch selectivity with respect to the first sacrificial layer 120. In some embodiments, the second pattern layer 130 may be formed using silicon, nitride, oxide, carbide, oxynitride, carbonate, carbonitride, and the like. The second pattern layer 130 may have substantially the same etch selectivity with respect to the first sacrificial layer 120 as the first pattern 110. For example, the second pattern layer 130 may be formed using substantially the same material as the first pattern 110. In embodiments where the first pattern 110 includes nitride and the first sacrificial layer 120 includes oxide and, the second pattern layer 130 may be formed using nitride. In embodiments where the first pattern 110 includes oxide and the first sacrificial layer 120 includes nitride, the second pattern layer 130 may be formed using oxide. In embodiments where the first pattern 110 includes polysilicon and the first sacrificial layer 120 includes oxide or nitride, the second pattern layer 130 may be formed using polysilicon.

Figure 3:
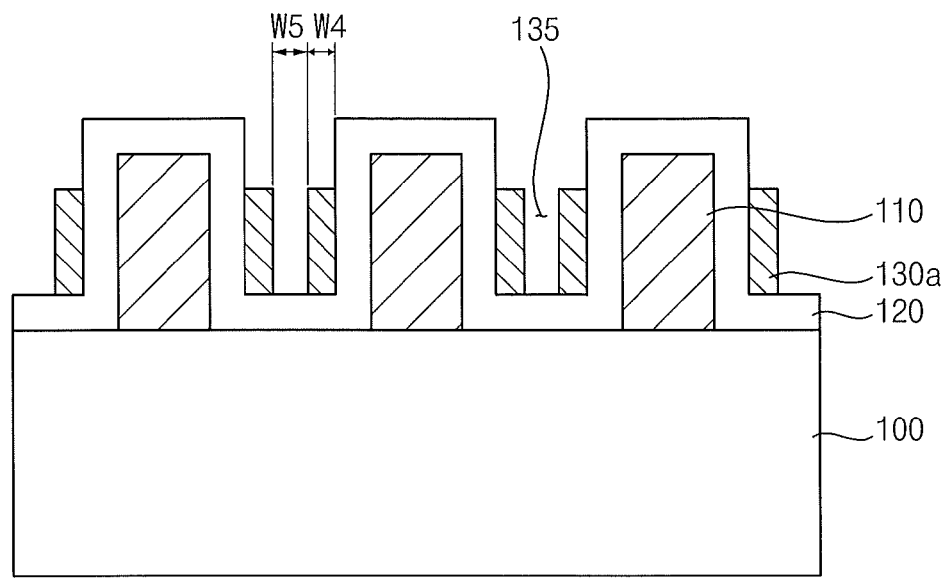

Referring now to FIG. 3, the second pattern layer 130 is etched to form a second pattern 130a on a sidewall of the first sacrificial layer 120. The second pattern 130a may have a height smaller than that of the first pattern 110 from the object structure 100. An upper surface, an upper sidewall and a lower surface of the first sacrificial layer 120 may be partially exposed by the second pattern 130a.

The second pattern 130a may have a fourth width (W4) substantially the same as the thickness of the second pattern layer 130. The second patterns 130a on the opposing sidewalls of the first patterns 110 may be spaced apart by a fifth width (W5) substantially the same as the width of the first recess.

An etch process may be performed on the second pattern layer 130 to form the second pattern 130a. The etch process may continue until the second pattern 130a is formed to have a height smaller than the height of the first pattern 110 from the object layer 100. Because the second pattern 130a has a height smaller than that of the first pattern 110, when the second sacrificial layer is planarized by a following process, the upper surface of the first pattern 110 may be exposed and then selectively removed without damaging the second pattern 130a.

In some embodiments, the etch process may be performed using an etching material having an etch selectivity with respect to the second pattern layer 130. Accordingly, the first sacrificial layer 120 may not be etched by the etch process. Therefore, although the first pattern 110 has an etch selectivity substantially the same as the second pattern layer 130, the first pattern 110 under the first sacrificial layer 120 may not be etched.

The etching material and process conditions may be properly controlled based on the materials included in the second pattern layer 130 and the first sacrificial layer 120. In some embodiments, the etch process may be a plasma dry etch process using an etching gas. The etching gas may a mixture gas including CxFy such as $C_3F_6$, $C_4F_6$, $C_4F_8$ and $C_5F_8$, CxHyFz (x, y and z are positive integers having a value between 1 and 10) such as $CH_2F_2$ and $CHF_6$, $Cl_2$, $BCl_2$, $NF_3$ and a mixture of CxFy and CxHyFz (x, y and z are positive integers having a value between 1 and 10), a mixture gas including CxFy (x and y are positive integers having a value between 1 and 10) and $O_2$, or a mixture gas including $O_2$ and Ar. In further embodiments, the etch process may be a wet etch process using an etching solution. Examples of the etching solution may be a fluoride-containing etching solution such as diluted HF (DHF), a hydrogen fluoride solution or buffered oxide etchant (BOE, a mixture solution of HF and $NH_4F$), SC-1 (a mixture solution of $NH_4OH$, $H_2O_2$ and $H_2O$), a $NH_4OH$ solution, a phosphoric acid solution, and the like For example, the second pattern layer 130 includes polysilicon, the second pattern 130a may be formed by a plasma etch process using a mixture gas of HBr, $Cl_2$ and $O_2$. In embodiments where the second pattern layer 130 includes oxide, the second pattern 130a may be formed by a wet etch process using DHF, BOE or SC-1, or by a plasma etch process using a fluoride-containing etching gas such as CxFy (x and y are positive integers having a value between 1 and 10). In embodiments where the second pattern layer 130 includes nitride, the second pattern 130a may be formed by a wet etch process using a hydrogen fluoride solution or a heated phosphoric acid solution, or by a plasma etch process using a mixture gas of CxFy and CxHyFz (x, y and z are positive integers having a value between 1 and 10) or a mixture gas of CxFy (x and y are positive integers having a value between 1 and 10) and $O_2$.

Figure 4:
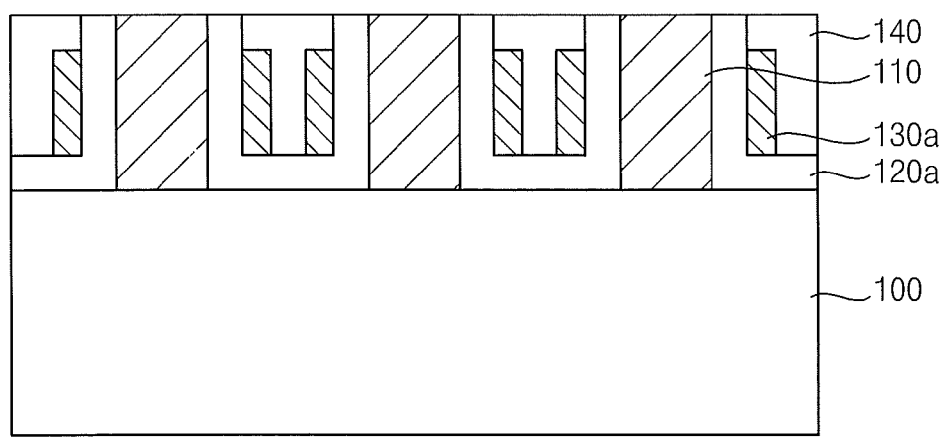

Referring now to FIG. 4, a second sacrificial layer pattern 140 is formed to cover the second pattern 130a. The second sacrificial layer pattern 140 fills up the first recess 135 between adjacent first sacrificial layer patterns 120a.

In order to form the second sacrificial layer pattern 140, after a second sacrificial layer is formed to cover the first pattern 110 and the second pattern 130a, a planarization process is performed on the second sacrificial layer and the first sacrificial layer 120 until the first pattern 110 is exposed, to form the first sacrificial layer pattern 120a and the second sacrificial layer pattern 140.

The second sacrificial layer may be formed using a material having an etch selectivity with respect to the first pattern 110 and the second pattern 130a. Accordingly, the first pattern 110 may be selectively removed by a following process without removing of the second sacrificial layer pattern 140. In some embodiments, the second sacrificial layer may be formed using a material having an etch selectivity with respect to the first and second patterns 110 and 130a substantially the same as the first sacrificial layer 120. For example, the first sacrificial layer 120 and the second sacrificial layer may be formed using substantially the same materials.

The first pattern 110 is exposed by the planarization process, but the second pattern 130a is not exposed. Because the second pattern 130a is formed to have a height smaller than that of the first pattern 110 from the object structure 100, the second pattern 130a remains under the second sacrificial layer pattern 140 after performing the planarization process. In some embodiments, the planarization process may be performed using a chemical mechanical polish process and/or an etch-back process.

Figure 5:
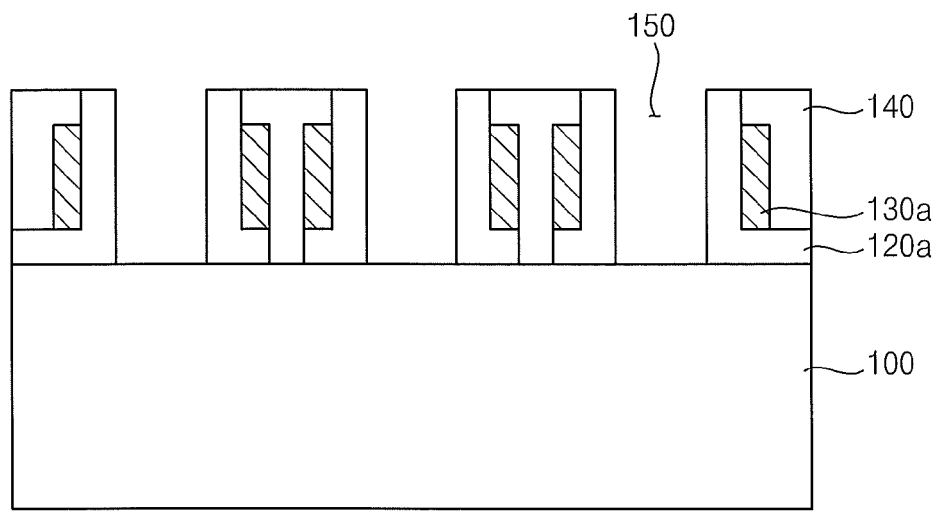

Referring now to FIG. 5, the first pattern 110 is removed by an etch process. As the first pattern 110 is removed, an opening 150 is formed to expose the object structure 100 between the adjacent first sacrificial layer patterns 120a. The opening 150 may have a width substantially the same as the first width (W1) of the first pattern 110.

When the first sacrificial layer pattern 120a and the second sacrificial layer pattern 140 are formed using a material having an etch selectivity with respect to the first pattern 110, only the first pattern 110 may be selectively removed by the etch process. In some embodiments, the etch process may be a plasma dry etch process using an etching gas. The etching gas may a mixture gas including CxFy such as $C_3F_6$, $C_4F_6$, $C_4F_8$ and $C_5F_8$, CxHyFz (x, y and z are positive integers having a value between 1 and 10) such as $CH_2F_2$ and $CHF_6$, $Cl_2$, $BCl_2$, $NF_3$ and a mixture of CxFy and CxHyFz (x, y and z are positive integers having a value between 1 and 10), a mixture gas including CxFy (x and y are positive integers having a value between 1 and 10) and $O_2$, or a mixture gas including $O_2$ and Ar. In further embodiments, the etch process may be a wet etch process using an etching solution. Examples of the etching solution may be a fluoride-containing etching solution such as DHF, a hydrogen fluoride solution or BOE (a mixture solution of HF and $NH_4F$), SC-1 (a mixture solution of $NH_4OH$, $H_2O_2$ and $H_2O$), a $NH_4OH$ solution, a phosphoric acid solution, and the like For example, in embodiments where the first pattern 110 and the second pattern 130a includes the same materials, the first pattern 110 may be removed by an etch process substantially the same as the etch process used to form the second pattern 130a. Accordingly, the first pattern 110 and the second pattern 130a may be formed using the same materials, to thereby simplify the processes of the final fine patterns.

Figure 6:
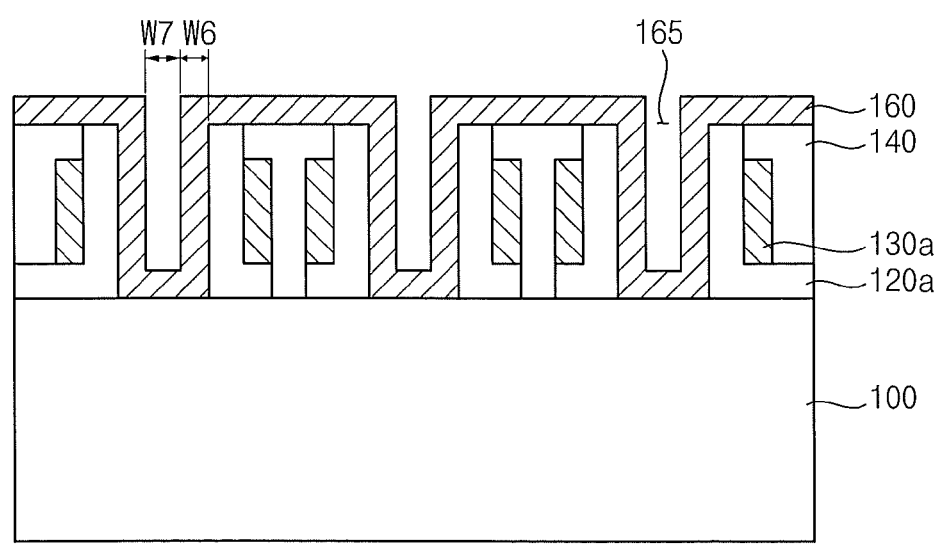

Referring now to FIG. 6, a third pattern layer 160 is formed conformally on the first sacrificial layer pattern 120a, the second sacrificial layer pattern 140a and sidewalls and a bottom face of the opening 150.

The third pattern layer 160 is formed conformally along profiles of the first sacrificial layer pattern 120a, the second sacrificial layer pattern 140 and the opening 150. The third pattern layer 160 may have a sixth width (W6). The sixth width (W6) of the third pattern layer 160 may determine a width of a third pattern 160a (see FIG. 7). Because the third pattern layer 160 is formed conformally along the profiles of the first and second layer patterns 120a and 140 and the opening 150, a second recess 165 is formed in the third pattern layer 160a between the opposing sidewalls of the opening 150 to have a seventh width (W7). The seventh width (W7) may determine a distance between third patterns 160a (see FIG. 7).

Accordingly, the third pattern layer 160 having the sixth width (W6) and the second recess 165 having the seventh width (W7) are formed in the opening 150 having the first width (W1). The first width (W1) of the opening 150 corresponds to the width of the first pattern 110. In the process of forming the first pattern 110, the first width (W1) of the first pattern 110 may be determined considering a sixth width (W6) of a third pattern 160a (see FIG. 7) and a seventh width (W7) of a distance between third patterns 160a (see FIG. 7). In some embodiments, the third pattern layer 160 may be formed by an atomic layer deposition process.

The third pattern layer 160 may be formed using a material having an etch selectivity with respect to the first sacrificial layer pattern 120a and the second sacrificial layer pattern 140. In some embodiments, the third pattern layer 160 may be formed using silicon, nitride, oxide, carbide, oxynitride, carbonate, carbonitride, and the like The third pattern layer 160 may have substantially the same an etch selectivity with respect to the first sacrificial layer pattern 120a and the second sacrificial layer pattern 140a as the first pattern 110 or the second pattern 130a. For example, the third pattern layer 160 may be formed using substantially the same material as the first pattern 110 or the second pattern 130a. The first pattern 110, the second pattern 130a and the third pattern layer 160 may be formed using substantially the same material.

Figure 7:
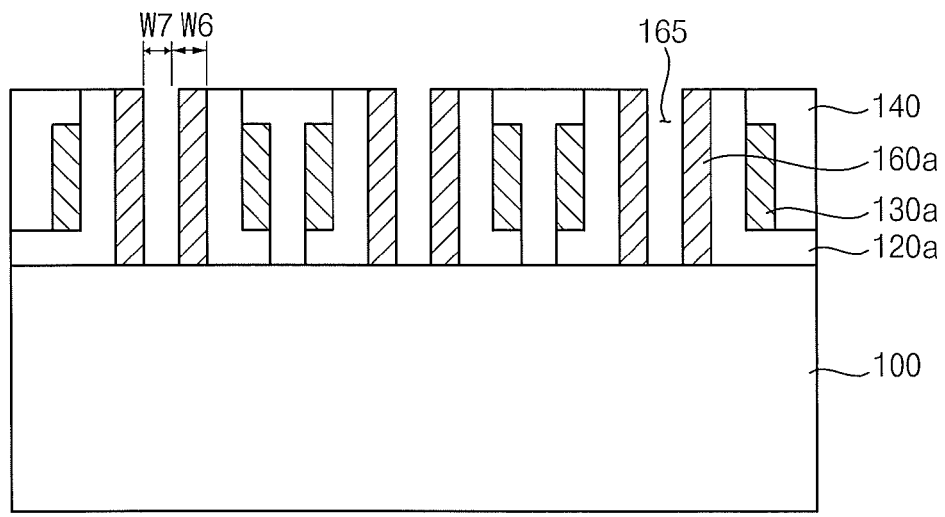

Referring now to FIG. 7, the third pattern layer 160 is partially etched until the upper surfaces of the first sacrificial layer pattern 120a and the second sacrificial layer pattern 140 are exposed, to form a third pattern 160a. The etch process is performed on the third pattern layer 160 to form the third pattern 160a on the sidewall of the first sacrificial layer pattern 120a. The third pattern layer 160 under the bottom face of the second recess 165 is etched so that the object structure 100 is partially exposed through the second recess 165.

The etch process may be performed using a material having an etch selectivity with respect to the third pattern layer 160. Accordingly, the third pattern layer 160 may be selectively removed by the etch process. In some embodiments, the etch process may be a plasma dry etch process using an etching gas. The etching gas may a mixture gas including CxFy such as $C_3F_6$, $C_4F_6$, $C_4F_8$ and $C_5F_8$, CxHyFz (x, y and z are positive integers having a value between 1 and 10) such as $CH_2F_2$ and $CHF_6$, $Cl_2$, $BCl_2$, $NF_3$ and a mixture of CxFy and CxHyFz (x, y and z are positive integers having a value between 1 and 10), a mixture gas including CxFy (x and y are positive integers having a value between 1 and 10) and $O_2$, or a mixture gas including $O_2$ and Ar. In further embodiments, the etch process may be a wet etch process using an etching solution. Examples of the etching solution may be a fluoride-containing etching solution such as DHF, a hydrogen fluoride solution or BOE (a mixture solution of HF and $NH_4F$), SC-1 (a mixture solution of $NH_4OH$, $H_2O_2$ and $H_2O$), a $NH_4OH$ solution, a phosphoric acid solution, and the like For example, the second pattern layer 130 includes polysilicon, the second pattern 130a may be formed by a plasma etch process using a mixture gas of HBr, $Cl_2$ and $O_2$. For example, in embodiments where the third pattern layer 160 is formed using a material having an etch selectivity substantially identical or similar to those of the first pattern 110 and the second pattern 130a, the third pattern layer 160 may be removed by an etch process substantially the same as the etch process used to remove the first pattern 110 or the second pattern layer 130.

Figure 8:
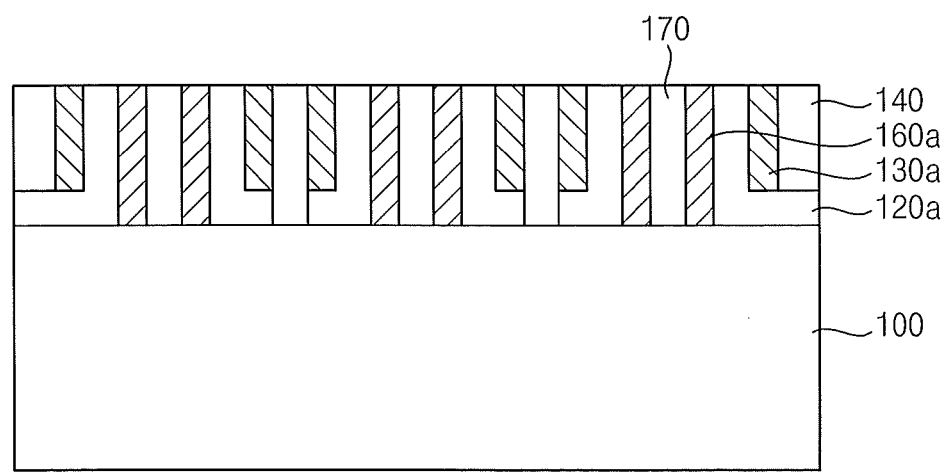

Referring now to FIG. 8, after a third sacrificial layer is formed to cover the first sacrificial layer pattern 120a, the second sacrificial layer pattern 140 and the third pattern 160a, a planarization process is formed on the third sacrificial layer until the second pattern 130a and the third pattern 160a are exposed, to form a third sacrificial layer pattern 170. The third sacrificial layer pattern 170 may fill up the second recess 165 between the third patterns 160a.

The third sacrificial layer may be formed using a material having an etch selectivity with respect to the second pattern 130a and the third pattern 160a. Accordingly, the first sacrificial layer pattern 120a, the second sacrificial layer pattern 140a and the third sacrificial layer pattern 170 may be selectively removed by a following process without removing of the second pattern 130a and the third pattern 160a. In some embodiments, the third sacrificial layer may be formed using a material having an etch selectivity with respect to the first, second and third patterns 110, 130a and 160a substantially the same as the first sacrificial layer 120 and the second sacrificial layer. For example, the first sacrificial layer 120, the second sacrificial layer and the third sacrificial layer may be formed using substantially the same materials.

In some embodiments, the planarization process may be performed using a chemical mechanical polish process and/or an etch-back process.

Figure 9:
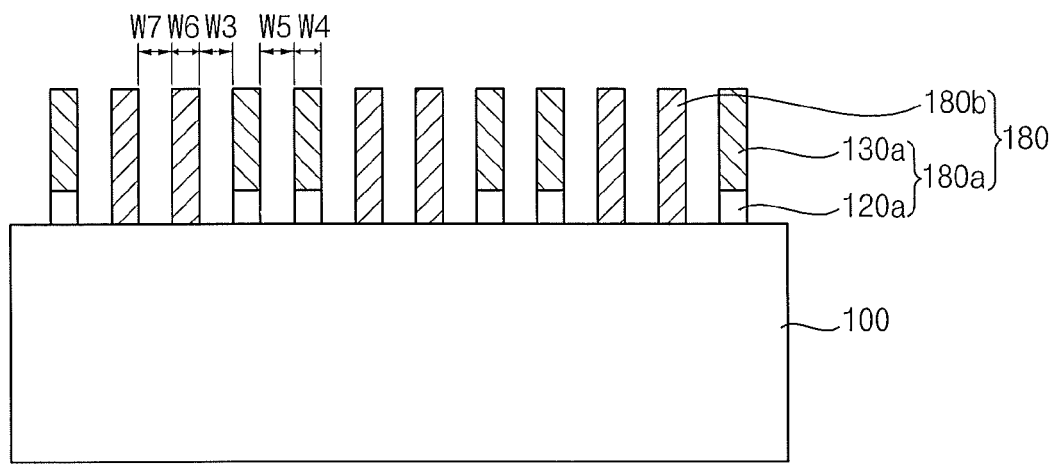

Referring now to FIG. 9, the first sacrificial layer pattern 120a, the second sacrificial layer pattern 140 and the third sacrificial layer pattern 170 are removed to form a fine pattern 180 on the object structure 100.

The fine pattern 180 includes a first fine pattern 180a and a second fine pattern 180b. The first fine pattern 180a includes the second pattern 130a and the first sacrificial layer pattern 120a. The first fine pattern 180a may have the fourth width (W4). The second fine pattern 180b includes the third pattern 160a. The second fine pattern 180b may have the sixth width (W6). The widths of the first fine pattern 180a and the second fine pattern 180b may be substantially the same as the thicknesses of the second pattern layer 130 and the third pattern layer 160, respectively.

A distance between the first fine pattern 180a and the second fine pattern 180b may be the third width (W3). A distance between the adjacent first fine patterns 180a may be the fifth width (W5). A distance between the adjacent second fine patterns 180b may be the seventh width (W7).

Since the distance between the first fine pattern 180a and the second fine pattern 180b is substantially the same as the thickness of the first sacrificial layer 120, the distance between the first fine pattern 180a and the second fine pattern 180b may be easily controlled by the thickness of the first sacrificial layer 120. Since the distance between the adjacent first fine patterns 180a is substantially the same as the width of the first recess 135, the distance between the adjacent first fine patterns 180a may be easily controlled by the thicknesses of the first sacrificial layer 120 and the second pattern layer 130. Since the distance between the adjacent second fine patterns 180b is substantially the same as the width of the second recess 165, the distance between the adjacent second fine patterns 180b may be easily controlled by the first width (W1) of the first pattern 110 and the thickness of the third pattern layer 160.

The width of the fine pattern 180 and the distance between the fine patterns 180 may be properly controlled by the width of the first pattern 110, the distance between the first patterns 110, the thicknesses of the second and third pattern layers 130 and 160, and the thicknesses of the first sacrificial layer 120, the second sacrificial layer 140 and the third sacrificial layer. For example, in embodiments where the fine patterns 180 have substantially the same widths, the second pattern layer 130 and the third pattern layer 160 may be formed to have the same thicknesses. In addition, in embodiments where the fine patterns 180 are spaced apart by the same distance, the thickness of the first sacrificial layer 120, the width of the first recess 135 and the width of the second recess 165 may be formed to be substantially equal to one another.

In some embodiments, the first sacrificial layer pattern 120a, the second sacrificial layer pattern 140a and the third sacrificial layer pattern 170 may be removed from the object structure 100 using a material having an etch selectivity. Accordingly, the first sacrificial layer pattern 120a, the second sacrificial layer pattern 140a and the third sacrificial layer pattern 170 may be selectively etched without damaging the second pattern 130a and the third pattern 160a.

In some embodiments, the first sacrificial layer pattern 120a, the second sacrificial layer pattern 140a and the third sacrificial layer pattern 170 may be formed using materials having an identical or similar etch selectivity. Accordingly, the first sacrificial layer pattern 120a, the second sacrificial layer pattern 140a and the third sacrificial layer pattern 170 may be removed together in the etch process.

As mentioned above, the first pattern 110 having a relatively large width may be formed by a photolithography process and the second and third patterns 130a and 160a having a relatively small width may be formed without performing a photolithography process. Thus, the fine patterns 180 may be formed to have a line width and pitch below the resolution limit of photolithography. In addition, the first, second and third patterns 110, 130a and 160a may be formed using substantially the same materials and the first, second and third sacrificial layer patterns 120a, 140 and 170 may be formed using substantially the same materials. Thus, the fine patterns 180 having line widths and pitches below the resolution limit of photolithography may be easily formed using two different materials. Further, the width of the first pattern 110, the distance between the first patterns 110, the thicknesses of the second and third pattern layers 130 and 160, and the thicknesses of the first sacrificial layer 120 and the second sacrificial layer 140 may be properly selected to control the width of the fine pattern 180 and the distance between the fine patterns 180, to form fine patterns having uniform line widths and pitches.

Methods of forming an isolation layer of a semiconductor device in accordance with some embodiments will now be discussed with respect to FIGS. 10 through 14. FIGS. 10 to 14 are cross sections views illustrating processing steps in the fabrication of isolation layers in accordance with some embodiments.

Figure 10:
FIGS. 10 to 14 are cross-sections illustrating processing steps in the fabrication of isolation layers in accordance with some embodiments.

Referring first to FIG. 10, a pad oxide layer 205 is formed on a substrate 200.

Examples of the substrate 200 may be a semiconductor substrate including silicon or germanium, a SOI substrate, a GOI substrate, and the like. The pad oxide layer 205 may be formed using silicon oxide. The pad oxide layer 102 may be formed by a thermal oxidation process or a chemical vapor deposition (CVD) process.

Figure 11:
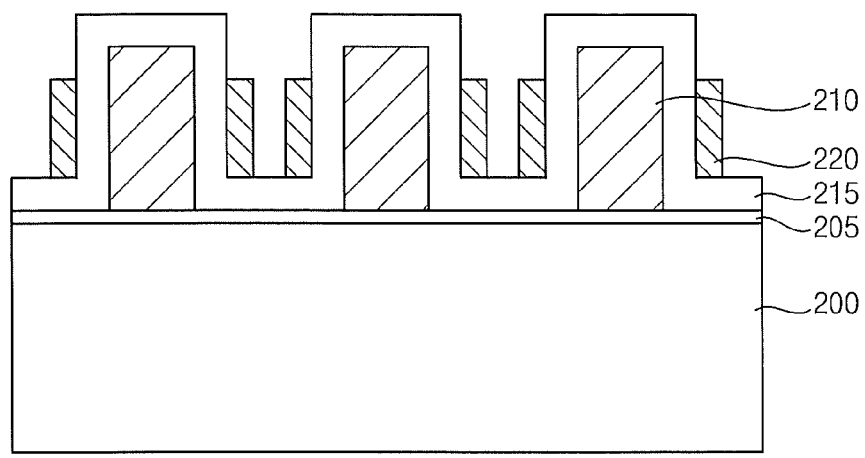

Referring now to FIG. 11, a first pattern 210, a first sacrificial layer 215 and a second pattern 220 are formed on the pad oxide layer 205. The first pattern 210, the first sacrificial layer 215 and the second pattern 220 may be formed using processes substantially the same as or similar to the processes described with reference to FIGS. 1 to 3.

The second pattern 220 may have a height smaller than that of the first pattern 210 from the substrate 200. Accordingly, when a second sacrificial layer 235 (see FIG. 12) covering the first pattern 210 and the second pattern 220 is planarized by a following process, only the upper surface of the first pattern 210 may be exposed and then selectively removed without damaging the second pattern 220.

The first pattern 210 and the second pattern 220 may be formed using materials having an etch selectivity with respect to the first sacrificial layer 215. In some embodiments, the first pattern 210 and the second pattern 220 may be formed using materials having a substantially identical or similar etch selectivity with respect to the first sacrificial layer 215. For example, the first and second patterns 210 and 220 may be formed using silicon nitride, and the first sacrificial layer 215 may be formed using silicon nitride.

Figure 12:
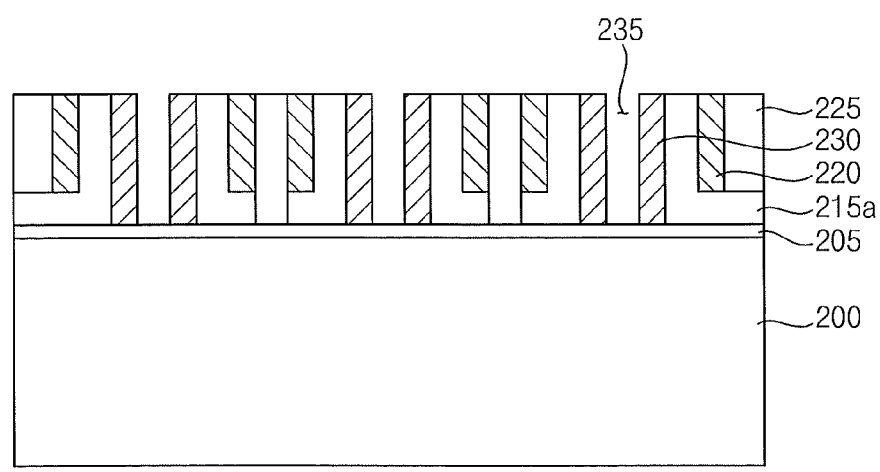

Referring now to FIG. 12, a third pattern 230 is formed on the substrate 200. The third pattern 230 may be formed using processes substantially the same as or similar to the processes described with reference to FIGS. 4 to 7.

In order to form the third pattern 230, after a second sacrificial layer is formed to cover the first pattern 210 and the second pattern 220, a planarization process is performed on the second sacrificial layer and the first sacrificial layer 215 until an upper surface of the first pattern 110 is exposed, to form the first sacrificial layer pattern 215a and the second sacrificial layer pattern 225.

The second sacrificial layer pattern 225 may be formed using a material having an etch selectivity with respect to the first and second patterns 210 and 220. In some embodiments, the first sacrificial layer pattern 215a and the second sacrificial layer pattern 225 may be formed using materials having a substantially identical or similar etch selectivity with respect to the first and second patterns 210 and 220. For example, in embodiments where the first and second patterns 210 and 220 are formed using silicon nitride, the first sacrificial layer pattern 215a and 225 may be formed using silicon oxide. The exposed the first pattern 210 is removed from the substrate 200 to form a first opening between the adjacent first sacrificial layer patterns 215a.

The first pattern 210 may be removed using an etching material having an etch selectivity with respect to the first and second sacrificial layer patterns 215a and 225. Accordingly, only the first pattern 110 is selectively removed by the etch process. In addition, because the second pattern 220 under the second sacrificial layer pattern 225 is not exposed, although the second pattern 220 has an etch selectivity substantially the same as the first pattern layer 210, the first pattern 110 may be removed without damaging the second pattern 220. For example, in embodiments where the first pattern is formed using silicon nitride and the first and second sacrificial layer patterns 215a and 225 are formed using silicon oxide, the first pattern 210 may be selectively removed by a wet etch process using a heated phosphoric acid solution.

After a layer is formed conformally on the first opening, the first sacrificial layer pattern 215a and the second sacrificial layer pattern 225, the layer is partially removed to form a third pattern 230 on a sidewall of the first sacrificial layer pattern 215a. A first recess 235 may be formed between the adjacent third patterns 230.

The third pattern 230 may be formed using a material having an etch selectivity with respect to the first and second sacrificial layer patterns 215a and 225. In some embodiments, the first, second and third patterns 210, 220 and 230 may be formed using substantially the same materials. For example, the first, second and third patterns 210, 220 and 230 may be formed using silicon nitride, and the first and second sacrificial layer patterns 215a and 225 may be formed using silicon oxide.

Figure 13:
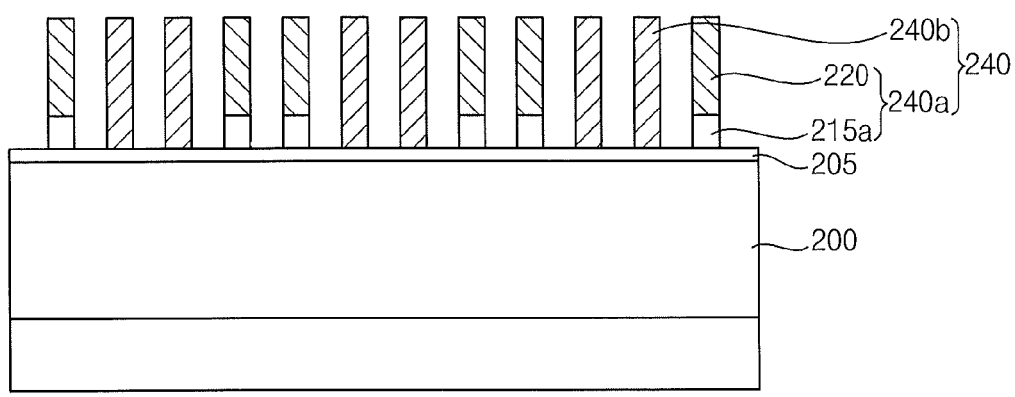

Referring now to FIG. 13, a mask 240 is formed on the pad oxide layer 205. In order to form the mask 240, a third sacrificial layer is formed on the second pattern 220, the third pattern 230, the first sacrificial layer pattern 215a and the second sacrificial layer pattern 225 to fill up the first recess 235. After the third sacrificial layer is planarized until the upper surfaces of the first and second patterns 230, the first sacrificial layer pattern 215a, the second sacrificial layer pattern 225 and the third sacrificial layer are removed to form the mask 240 having a first mask 240a and a second mask 240b on the pad oxide layer 105.

The third sacrificial layer may be formed using a material having an etch selectivity with respect to the second and third patterns 220 and 230. Accordingly, the first sacrificial layer pattern 215a, the second sacrificial layer pattern 225 and the third sacrificial layer may be selectively removed by an etch process. In some embodiments, the first sacrificial layer pattern 215a, the second sacrificial layer pattern 225 and the third sacrificial layer may be formed using substantially the same materials. For example, the first, second and third patterns 210, 220 and 230 may be formed using silicon nitride, and the first sacrificial layer pattern 215a, the second sacrificial layer pattern 225 and the third sacrificial layer may be formed using silicon oxide. In these embodiments, the first sacrificial layer pattern 215a, the second sacrificial layer pattern 225 and the third sacrificial layer may be removed by a plasma etch process using a mixture gas of $C_xF_y$ (x and y are positive integers having a value between 1 and 10) such as $C_3F_6$, $C_4F_6$, $C_4F_8$ or $C_5F_8$, or by a wet etch process using a fluoride-containing etching solution such as DHF, a hydrogen fluoride solution or BOE (a mixture solution of HF and $NH_4F$) or SC-1 (a mixture solution of $NH_4OH$, $H_2O_2$ and $H_2O$).

The first mask 240a includes the second pattern 220 and the first sacrificial layer pattern 215a. The second mask 240b includes the third pattern 230. Accordingly, the widths of the first pattern 210, the first sacrificial layer 215, the second sacrificial layer and the third sacrificial layer may be controlled to form the mask 240 having line widths and pitches to be required.

Figure 14:
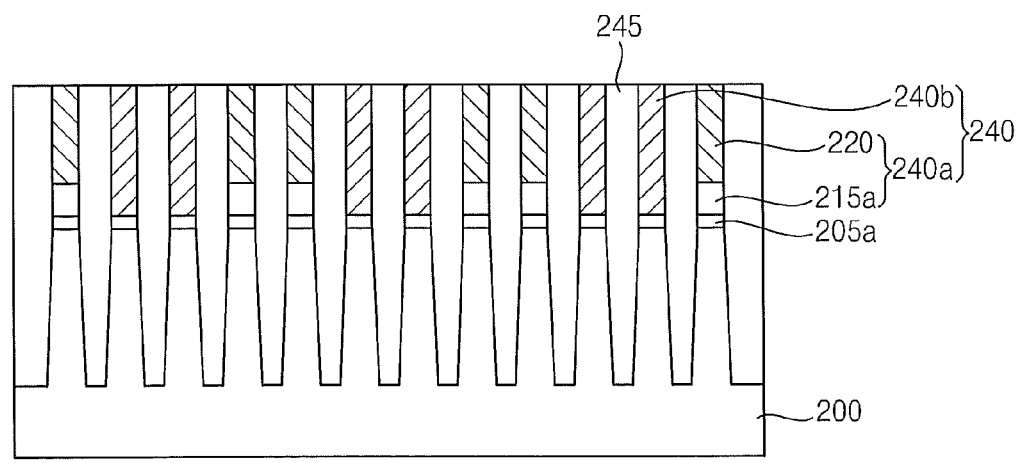

Referring now to FIG. 14, after the pad oxide layer 205 and the substrate 200 are etched using the mask as an etching mask to form a pad oxide layer pattern 205a and a trench in the substrate 200, the trench is filled with an insulation material to form an isolation layer on the substrate 200.

According to some embodiments, in methods of forming the isolation layer 245, the isolation layer 245 having a very small width may be formed on the substrate 200 using the mask 240 having a line width smaller than the minimum line width that could be obtained in a conventional photolithography process. In addition, the line widths and pitches of the mask 180 may be easily controlled by the widths of the layers and the sacrificial layers for forming the first, second and third patterns 210, 220 and 230. Accordingly, the isolation layer may be effectively formed to have uniform and fine line widths. Further, the mask 240 having a line width smaller than the minimum line width that could be obtained in a conventional photolithography process may be formed using two different materials having different etch selectivities, to thereby simplify the processes of forming the mask.

As mentioned above, according to some embodiments, a fine pattern may be formed uniformly to have a line width smaller than the minimum line width that could be obtained in a photolithography process. Further, the patterns having fine line widths may be easily formed using two different materials having different etch selectivities, to thereby improve productivity of manufacturing a semiconductor device.

The foregoing is illustrative of some embodiments and is to not be construed as limiting thereof. Although a few some embodiments have been described, those skilled in the art will readily appreciate that many modifications are possible in some embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A method of forming a pattern in semiconductor device, comprising:
    forming first patterns spaced apart from one another on an object structure;
    forming a first sacrificial layer conformally on the first patterns and the object structure;
    forming a second pattern on a sidewall of the first sacrificial layer, the second pattern having a smaller height than that of the first pattern from an upper surface of the object structure;
    selectively removing the first patterns to form an opening that exposes the object structure; and
    forming a third pattern on a sidewall of the opening, wherein a width of the first pattern is greater than twice a width of the third pattern.

2. The method of claim 1, wherein forming the second pattern comprises, forming a first pattern layer conformally on the first sacrificial layer; and etching the first pattern layer until an upper surface, an upper sidewall and a lower surface of the first sacrificial layer are at least partially exposed.

3. The method of claim 1, wherein forming the opening comprises, forming a second sacrificial layer to cover the first sacrificial layer and the second pattern; and performing a planarization process on the first sacrificial layer and the second sacrificial layer to expose the first pattern.

4. The method of claim 3, wherein forming the third pattern comprises, forming a second pattern layer conformally on the first sacrificial layer, the second sacrificial layer and the opening after performing the planarization process; and selectively removing the second pattern layer until the first sacrificial layer and the second sacrificial layer are exposed.

5. The method of claim 1, further comprising:

forming a third sacrificial layer on the object structure to cover the third pattern after forming the third pattern;

planarizing the first sacrificial layer, the second sacrificial layer and the third sacrificial layer until the second pattern and the third pattern are exposed; and removing the first sacrificial layer, the second sacrificial layer and the third sacrificial layer.

6. The method of claim 5, wherein the first pattern, the second pattern and the third pattern are formed using materials having an etch selectivity with respect to the first sacrificial layer, the second sacrificial layer and the third sacrificial layer.

7. The method of claim 6, wherein the first pattern, the second pattern and the third pattern are formed using the same materials.

8. The method of claim 6, wherein the first sacrificial layer, the second sacrificial layer and the third sacrificial layer are formed using the same materials.

9. The method of claim 1, wherein a distance between the first patterns is greater than twice a width of the second pattern.

* * * * *